United States Patent [19]

Vaisanen et al.

[11] Patent Number: 5,423,070
[45] Date of Patent: * Jun. 6, 1995

[54] LOGIC CONTROLLED TUNING SIGNAL LEVEL AND DEVIATION COMPENSATION IN A RADIO TELEPHONE

[75] Inventors: Risto Vaisanen; Aki Leppanen, both of Salo, Finland

[73] Assignee: Nokia Mobile Phones Ltd., Salo, Finland

[*] Notice: The portion of the term of this patent subsequent to May 17, 2011 has been disclaimed.

[21] Appl. No.: 230,161

[22] Filed: Apr. 19, 1994

Related U.S. Application Data

[63] Continuation of Ser. No. 586,076, Sep. 21, 1990, Pat. No. 5,313,656.

[30] Foreign Application Priority Data

Sep. 25, 1989 [FI] Finland ............................ 894527

[51] Int. Cl.6 .................................................. H04B 17/00
[52] U.S. Cl. ............................. 455/67.1; 455/67.4; 455/186.1; 455/226.1; 379/1
[58] Field of Search ................... 455/67.1, 67.4, 69, 455/70, 88, 115, 185.1, 186.1, 226.1, 226.2, 226.4; 379/1, 27, 58

[56] References Cited

U.S. PATENT DOCUMENTS 5,201,063 4/1993 Tam et al. ........................... 455/67.4
5,313,656 5/1994 Vaisanen et al. .................... 455/67.1

Primary Examiner—Reinhard J. Eisenzopf
Assistant Examiner—Chi H. Pham
Attorney, Agent, or Firm—Darby & Darby

[57] ABSTRACT

In a method according to the invention the tuning information determined by a measuring computer (20) is stored in the memory of the radio telephone (1). In operation the microprocessor (10) receives from the sensors (14) information e.g. about the temperature, according to which it selects from its memory tuning data and adjusts signal levels and deviations through logic controlled amplifiers (16, 17). The tuning can be made automatically, without opening the casing of the radio telephone.

15 Claims, 1 Drawing Sheet

LOGIC CONTROLLED TUNING SIGNAL LEVEL AND DEVIATION COMPENSATION IN A RADIO TELEPHONE

This is a continuation application of Ser. No. 07/586,076, filed Sep. 21, 1990 now U.S. Pat. No. 5,313,656.

BACKGROUND OF THE INVENTION

The present invention relates to a logic controlled method of tuning signals and/or deviations in a radio telephone having a logic section controlling its operation, and the use of this method in series production and maintenance. The invention also relates to a radio telephone, tuned with a method according to the invention.

In a radio telephone some signal levels and deviations must be kept within the adjusted value under all conditions, independent of temperature. Some of these signals include for example the low frequency level of the receiver, the deviation of the transmitter or of the control signal, etc. The signals pass through e.g., amplifiers, filters, detector circuits, mixers and modulators. Temperature causes amplification changes or deviations in all of these stages. The most common approach in the prior art is to accept these changes, and to compensate them by temperature dependent resistances such as NTC and PTC resistors.

However, this approach has proved to be a poor solution because some circuits, such as filters and detector circuits, behave differently in different temperatures, and it is not possible to fully predict the changes. The variations of the compensating component tolerances also affect on the changes.

The prior art solution was to accept a poorer yield in production, or to use better quality components. Both alternatives lead to increased production costs and moreover, the better quality components may increase the size and power consumption of the radio telephone, and thus impossible to use in small sized handsets.

SUMMARY OF THE INVENTION

The object of the invention is to devise a method, which solves the problems of the prior art without the drawbacks discussed above.

In the present invention individual tuning results for selected operating conditions are stored in the radio telephone's memory as compensating values. When the radio telephone is operating the respective signal (level and/or deviation) is controlled and corrected by the stored compensating value according to the tuning results by the logic controlled amplifier. Preferably, the tuning is performed by connecting the tuning equipment to the normal external connections of the radio telephone, so that the tuning may be performed without opening the radio telephone casing.

This tuning arrangement may be applied both to the final testing of production of radio telephones, and to the maintenance of radio telephones.

The radio telephone according to one embodiment of the present invention includes sensors connected to the logic section for detecting the radio telephone's operating channel and temperature ranges, and a logic controlled amplifier located in the signal path, which amplifies the signal according to data corrected with the compensating values that correspond to the operating conditions.

BRIEF DESCRIPTION OF THE DRAWINGS

The invention is described in more detail by way of an example with reference to the accompanying drawing, in which.

DESCRIPTION OF THE EXEMPLARY EMBODIMENT

Figure 1:
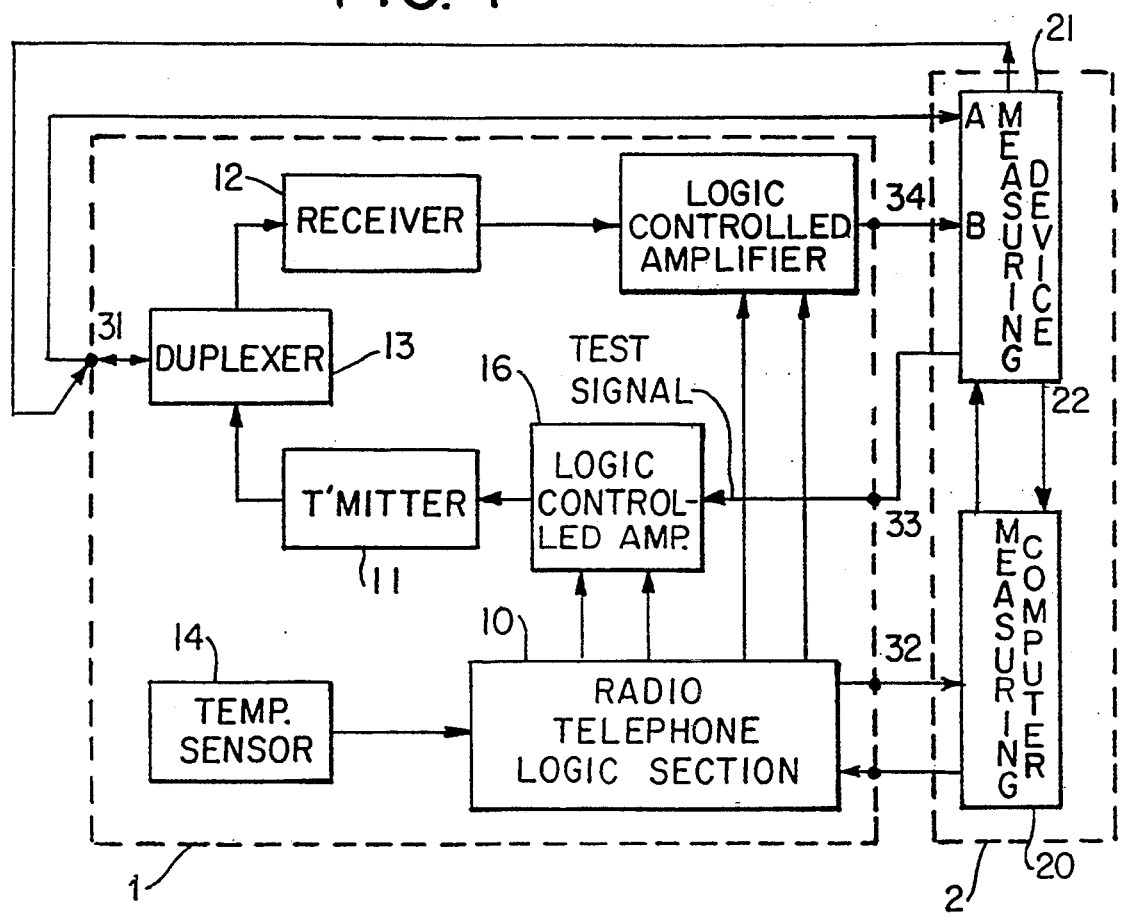
FIG. 1 is a simplified block diagram illustrating the tuning arrangement according to the present invention.

Referring to FIG. 1 the tuning equipment 2 is connected to the radio telephone's 1 antenna interface 31, auxiliary equipment interface 32 and the low frequency interfaces 33, 34. The test signal selected for the tuning (e.g., a constant microphone voltage or sound pressure to the microphone) is connected from the measuring device 21 of the tuning equipment 2 to the radio telephone interfaces 31 or 33. The measuring computer 20 of the tuning equipment is connected to the radio telephone's logic section 10 through the auxiliary interface 32. The measuring computer 20 can instruct the logic section 10 to control the radio telephone to select a desired channel (radio frequency) and control the logic controlled amplifiers 16, 17, which adjust the level and/or deviation of the signal to be tuned.

When the test signal is connected to the low frequency interface 33, the modulating audio signal (which normally comes from the microphone) is amplified by logic controlled amplifier 16 and is then connected as the output power of the transmitter 11 to the antenna interface 31, e.g., through a duplex filter 13, and it will be measured with by the measuring device 21. The measuring result is transmitted on an internal bus 22 to the measuring computer 20.

In the other signal direction, the radio frequency test signal from the measuring devices 21 is directed to the antenna interface 31. The antenna interface 31 is connected to the radio telephone receiver 12, which supplies an audio signal that is amplified by logic controlled amplifier 17, and the resulting signal (in normal operation directed to the earphone) is measured by measuring devices 21 through the interface 34. The measurement information is transmitted on an internal bus 22 to the measuring computer 20.

The radio telephone also includes a temperature sensor 14 to detect the internal temperature of the radio telephone.

The logic section 10 also includes a microprocessor, memories—especially a non-volatile memory to store programs and compensating data—and an analog-to-digital (A/D) converter, which converts the operating temperature of the batteries or accumulators and the voltage from the temperature sensor 14 into a digital format which can be used by the microprocessor. During tuning, the microprocessor is connected to the measuring computer 20 via the auxiliary equipment interface 32, through which information is exchanged in both directions, e.g., information about the temperature measured by the sensor 14 is sent to the measuring computer and set values from the measuring computer are sent to the microprocessor.

The operating channel (or channel range) and the temperature (or temperature range) measured by the sensor 14 constitute the operating conditions of the radio telephone.

Tuning the radio telephone according to the invention is carried out in the following manner. The tuning is initially performed at room temperature. The radio telephone is placed in a climate chamber (cold/hot chamber), and the measuring devices 21 are connected to the antenna interface 31 and the low frequency interfaces 33, 34.

First, information about the signal (level or deviation) to be tuned and a set value are connected from the measuring computer 20 via the auxiliary interface 32 to the microprocessor 10. The logic section 10 of the radio telephone 1 controls the logic controlled amplifier so that the target value of the signal to be tuned is reached with a selected, sufficient precision. The modulation sensitivity is adjusted at room temperature as a function of the selected channels. The deviation is measured on the middle channel. Next, the extreme high and low channels' deviations from the middle channel value are checked (in several parts) and stored as compensating factors in the non-volatile memory of the microprocessor 10. During operation of the radio telephone these calculated compensating factors, or values measured on the extreme channels, are used by the radio telephone software for the respective channels.

Second, the temperature of the climate chamber is changed to the minimum temperature to be tested (e.g. −25° C.). When the temperature sensor 14 has determined that the desired internal temperature is achieved, the tuning step described above is repeated. The obtained tuning values are used by the radio telephone when operated below a certain temperature.

Third, the temperature of the climate chamber is changed to the maximum operating temperature (e.g., +55° C.), and the same procedure is repeated. The obtained tuning values are used by the radio telephone when operated above a certain temperature.

It is possible for the second and third steps to be performed automatically, so that the mean tuning values in cold and hot of the previously produced telephones are stored in the memory of the measuring computer 20. The telephone is tuned with set values in accordance with these mean values, and then the measurement (levels and deviations) is performed. If any signal to be measured deviates from the tuning value, beyond an acceptable deviation limit, the measuring computer 20 will repeat the tuning at the temperature in question, after which the tuning values are stored into the radio telephone memory.

It should be noted that the tuning may be performed in a different order on the available climate chamber arrangement and other necessities of commercial productions. The number of operating conditions to be tuned may be chosen to suit the production and the operation of the radio telephone. The number of the operating conditions can be reduced in a convenient way by using only one tuning point representing a middle range, a higher range and a lower range, respectively, for each variable (channel, temperature). For example, in practice the ranges could be:

(1) a middle channel representing a middle range, the highest and the lowest channel representing the higher and the lower ranges; and correspondingly
(2) room temperature (e.g., 25° C. for the range +5° ... +45° C.), maximum temperature (e.g., +55° C. for the range +45 ... +85° C.). and minimum temperature (e.g., −10° C. for the range −25 ... +5° C.).

In production the, because the tuning can be performed without opening the telephone's casing, tuning can be made in the final testing, when the radio telephone is otherwise completely ready. Furthermore, by suitable programming tuning steps in the measuring computer, the tuning can be made completely automatically, whereby the results of the tuning will become more reliable (no human errors). Automating the testing will reduce the amount of time and personnel required to test each radio telephone. From a production management standpoint the inventive method signifies a great advantage, for example, if production is transferred to another plant, the automatic tuning program does not require much personnel training, as all of the information required in the tuning can be incorporated in the tuning programs of the measuring computer.

The tuning method according to the invention can also conveniently be used in the maintenance of radio telephones, whereby the tuning equipment may be replaced by simpler service equipment, with which e.g., the tuning of the radio telephone is checked, and/or the tuning is made only at room temperature. Then the measuring of the signals and the storing of tuning results will be carried out in the same way as in automatic tuning, but the person performing the tuning will calculate the compensating constants or factors and decide on the tuning result.

In a radio telephone tuned according to the method of the present invention, the temperature is measured with a sensor 14 and A/D-converters (not shown). In accordance with the operating conditions the microprocessor 10 selects from its non-volatile memory a relevant compensating constant or a set value tuned for the operating conditions, and the amplification of the logic controlled amplifiers is set according to this value.

Figure 2:
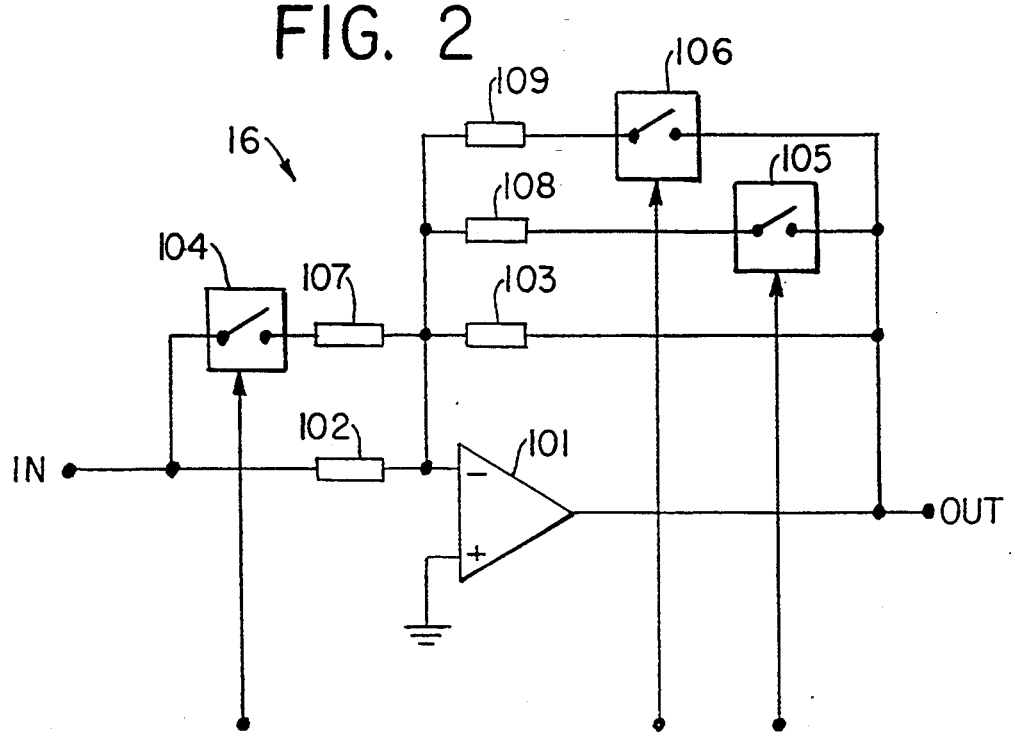
FIG. 2 is a circuit diagram of a logic controlled amplifier in a radio telephone according to the present invention.

FIG. 2 shows a circuit diagram of a logic controlled amplifier 16 (or 17 in FIG. 1) used in a radio telephone according to the invention. The amplifier 16 comprises an operational amplifier 101, feed-back resistors 102 and 103, and analog switches 104, 105, and 106. With the analog switches 104, 105 and 106, controlled by the microprocessor 10 (not shown), a desired combination of other feed-back resistors 107, 108, and 109 can be connected in parallel with the main feed-back resistors 102 and 103. In the example of FIG. 2 three switchable resistors are used, whereby the total number of the switchable amplification steps is 8. The number of the switchable resistors can be selected in accordance with the number of required amplification steps (the number of amplification steps=$2^N$, where N is the number of the switchable resistors).

No analog compensating circuits are required in the radio telephone according to the invention, and thus the number of components is reduced. It is further possible to allow larger tolerance values for the components, because it is possible to perform a temperature compensation individually for every radio telephone. Thus, the production yield will increase. The achieved compensations will also be more accurate, because the compensating components will not affect the compensation results. At the same time a saving in circuit board area is achieved.

The invention can be applied to different types of analog and digital radio telephones, cellular radio telephones, portable and mobile radio telephones.

We claim:

1. A method for tuning signal levels and deviations in a radio telephone having an adjustable output response means, comprising the steps of:
   connecting external testing equipment to the radio telephone antenna interface and low frequency interface;
   transmitting a test signal from the external testing equipment to the radio telephone via one of the antenna interface and the low frequency interface;
   measuring with the external testing equipment an output response from the radio telephone to the test signal, the output response being at one of the antenna interface and the low frequency interface; and
   adjusting the output response of the radio telephone until a desired signal level is obtained using stored compensation values, the compensation values being for correcting either of the signal level and deviation when the radio telephone is operating.

2. The tuning method of claim 1, wherein the tuning is performed without opening the radio telephone.

3. The tuning method of claim 1, including the steps of sequentially performing the tuning for several channels and operating temperatures.

4. The tuning method of claim 3, further comprising the step of providing the radio telephone logic section with an initial set of compensation values derived from values obtained from previously tuned telephones, the initial set of compensation values being provided before the sequential tunings are performed.

5. The tuning method of claim 1, for maintaining the correct operation of radio telephones.

6. The tuning method of claim 3, for maintaining the correct operation of radio telephones.

7. The tuning method of claim 3, wherein the step of adjusting using compensation values includes adjusting using compensation values for each sequentially performed tuning.

8. An apparatus for tuning signal levels and deviations in a radio telephone having an adjustable output response means, comprising:
   (1) external tuning equipment connectable to the radio telephone antenna interface and low frequency interface; the tuning equipment including:
   (a) means for generating and transmitting a test signal to the radio telephone via one of the antenna interface and the low frequency interface;
   (b) means for measuring a radio telephone signal at one of the antenna interface and the low frequency interface, the radio telephone signal responding to the test signal;
   (c) means for adjusting the adjustable output response means of the radio telephone until a desired output response is obtained, using stored compensation values; and
   (2) means for selecting from among the stored compensation values, the compensation values being related to an amount of adjustment necessary to obtain the desired output response, the compensation values being for correcting either of the signal level and deviation when the radio telephone is operating.

9. The tuning apparatus of claim 8, wherein the external tuning equipment includes a computer having a stored program and target values for the signal to be tuned, so that the tuning is performed either automatically or semi-automatically.

10. The tuning apparatus of claim 8, further including sensors connected to the radio telephone for detecting the radio telephone's temperature and operating channel and wherein the compensation values are stored in the radio telephone, the adjustable output response means includes a logic controlled amplifier for amplifying the radio telephone response signal according to data corrected with the compensating values, and the logic controlled amplifier is controlled by a logic section of the radio telephone.

11. The tuning apparatus of claim 10, wherein the logic section comprises a microprocessor.

12. The tuning apparatus of claim 10 wherein the sensors include a device for detecting the operating channel and a device for detecting the operating temperature.

13. The tuning apparatus of claim 10, wherein the logic controlled amplifier includes an operational amplifier having a feed-back loop comprising feed-back resistors connected in parallel with analog switches, the analog switches being controlled by the logic section for selectively connecting the feed-back resistors to produce the desired adjustment in amplification.

14. The tuning apparatus of claim 8, further including sensors for detecting the radio telephone's temperature and operating channel, wherein the means for adjusting adjusts the output response for several channels and operating temperatures.

15. The tuning apparatus of claim 8 wherein the compensation values are stored in the radio telephone.

* * * * *